(12) United States Patent
Lee et al.

(10) Patent No.: US 6,211,086 B1
(45) Date of Patent: Apr. 3, 2001

(54) METHOD OF AVOIDING CMP CAUSED RESIDUE ON WAFER EDGE UNCOMPLETED FIELD

(75) Inventors: Tzung-Han Lee, Taipei; Horng-Nan Chern, Tai-Nan County, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/328,244

(22) Filed: Jun. 8, 1999

(51) Int. Cl.[7] .......................... H01L 21/44; H01L 21/302
(52) U.S. Cl. .......................... 438/688; 438/672; 438/745; 438/759
(58) Field of Search .................................. 438/688, 672, 438/627, 634, 641, 637, 685, 656, 745, 754

(56) References Cited

U.S. PATENT DOCUMENTS

| | | | |
|---|---|---|---|
| 5,330,931 | * | 7/1994 | Emesh et al. ............................ 437/60 |
| 5,573,633 | * | 11/1996 | Gambino et al. ...................... 437/228 |
| 5,854,140 | * | 12/1998 | Jaso et al. ............................... 438/740 |
| 6,110,828 | * | 8/2000 | Guo et al. ............................... 438/688 |
| 6,133,158 | * | 10/2000 | Obeng et al. ........................... 438/745 |

* cited by examiner

Primary Examiner—Richard Elms
Assistant Examiner—Michael S. Lebentritt

(57) ABSTRACT

A method for forming a semiconductor device with avoiding chemical mechanical polishing caused residue on uncompleted fields of wafer edge is disclosed. The method comprising removing all conductive layers and silicon nitride layers on the uncompleted fields, thereby the height of the uncompleted fields will not higher than the height of the semiconductor device.

19 Claims, 2 Drawing Sheets

METHOD OF AVOIDING CMP CAUSED RESIDUE ON WAFER EDGE UNCOMPLETED FIELD

BACKGROUND OF THE INVENTION

1. Field of the Invention

The present invention relates to semiconductor manufacturing, and in particular to a method of avoiding CMP caused residue on wafer edge uncompleted field.

2. Description of the Prior Art

Manufacturing of semiconductor substrates encompasses hundreds of different process steps. The steps involve creating patterns, introducing dopants, and depositing films on a silicon substrate repetitively throughout the manufacturing process to form integrated structures. Because the various structures that are built on a substrate or a wafer are serial in nature, that is, that they are built one on top of another in a sequential manner, it becomes very important that each layer of structure is substantially defect free before the next one is placed thereon.

Defects are generally caused when an unwanted particulate matter unintentionally lands between features on a layer and "bridges" or connects them, and therefore, disables them by "shorting" under certain conditions; or when an unwanted particulate matter lands on a feature, and disables it by creating an unwanted "open" in the circuitry. The size of the particulates in relation to the size of the features play an important role in creating the defects. As the size of features in today's high density integrated circuit chips (IC) are getting miniaturized ever so incessantly, control over the size of contaminants introduced into the manufacturing line need also be scrutinized diligently if acceptable levels of yield are to be maintained. Thus, for submicron lithographic technologies where the wiring features or patterns are less than one micrometer, $\mu$, in width, the size of the invading particulate matter need be controlled to between about one fifth to one tenth of the width, or between about 0.1–0.25$\mu$. With chip sites of about 5 mm.times.5 mm on a wafer, or of an area of 25 mm$^2$, the allowable defect density is about 0.02 pieces/mm$^2$ in order to achieve satisfactory levels of yield. For larger chip areas on the order of 100 mm$^2$, the defect density must be below 0.003 pieces/mm$^2$ in order to achieve the same yield.

Defects can best be avoided if the sources of the contaminants or dust particles are eliminated. There are mainly two major sources for contaminants that are introduced into a manufacturing line: the first one is that which resides outside the work piece, namely the wafer, such as the ambient air surrounding the wafer, or fluids, such as chemicals, that are brought to the work piece for various processes that take place at the work-station. These contaminants that are external to the work piece and sometimes are known as "drop-ons", can generally be kept away from the work-piece by proper use of filters, and other implements that are commonly available. The other source for particle contaminants is the work piece itself, and the contaminants generated from the work-piece is sometimes referred to as being "process-induced." As work is being performed on the work-piece, the work-piece releases particulate matter, or dust, due to abrasion or breakage caused by excessive stresses imposed on certain parts of the work-piece. Further on, the uncompleted fields of wafer edge with higher altitude will cause a lot of particulate matter after chemical mechanical polishing (CMP).

A case in point is when a wafer, for example, has ups and downs topography. As expected, defect particles will stay in fovea region and near uncompleted field of wafer edge to kill yield. Moreover, topography will cause photo-defocus issue at the following layers.

SUMMARY OF THE INVENTION

In accordance with the present invention, a method is provided for manufacturing semiconductor device that substantially avoids residue near uncompleted field.

It is another object of this invention to improve the CMP uniformity and avoid SiN residue near uncompleted field.

It is a further object of this invention to prevent from topography caused next layers photo-defocus.

It is still another object of this invention to increase the yield of manufacturing semiconductor device.

In one embodiment, a method for forming a semiconductor device with avoiding chemical mechanical polishing caused residue on uncompleted fields of wafer edge is disclosed, wherein a band is reserved between the semiconductor device and the uncompleted. The method comprises removing all conductive layers on said uncompleted fields and removing all silicon nitride layers on said uncompleted fields, thereby the height of said uncompleted fields will not higher than the height of said semiconductor device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
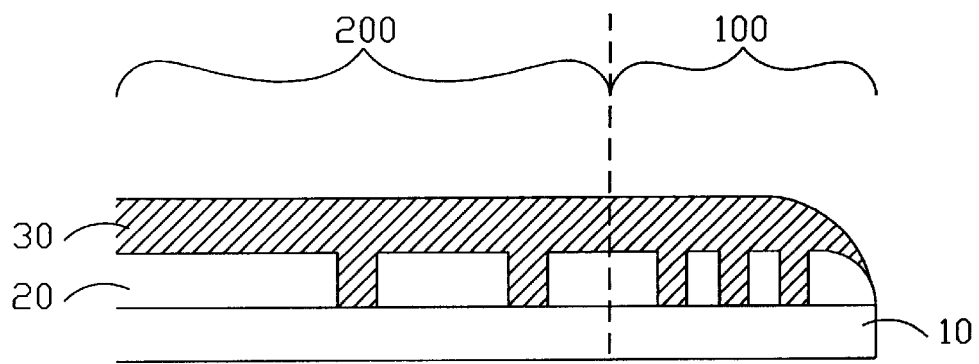
FIGS. 1A to 1D are schematic representations of structures at various stages during the formulation of semiconductor device with avoiding CMP caused residue on wafer edge uncompleted fields in accordance with a method disclosed.

Referring to FIG. 1A, a substrate 10 is provided with a silicon oxide layer 20 formed thereon. A dashed line separates this substrate 10 into two parts, where region 100 is an uncompleted field of wafer edge and region 200 is a portion of a semiconductor device. Then, interconnect hole patterns are transferred into the silicon oxide layer 20 on both semiconductor device and uncompleted field by using any conventional method. A conductive layer 30 is then deposited on the silicon oxide layer and filled all interconnect holes. This layer 30 may be doped-polysilicon, aluminum, or any other metal including alloy, and the formulation of this layer 30 depends on the materials themselves.

Figure 1B:
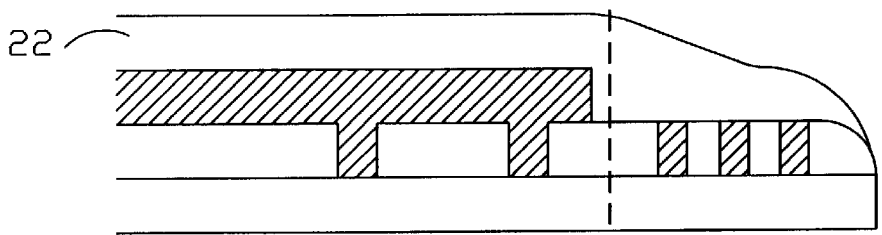

As a key step of this invention, conductive layer 30 is removed in uncompleted region, i.e., region 100, as shown in FIG. 1B. The method for removing this conductive layer 30 depends on the materials themselves. For example, the conductive layer 30 over uncompleted field is exposed in lithography for most metal. Then, another silicon oxide layer 22 is form on both uncompleted field and device region. This step improves the CMP uniformity and prevents from topography issue at following steps.

Figure 1C:
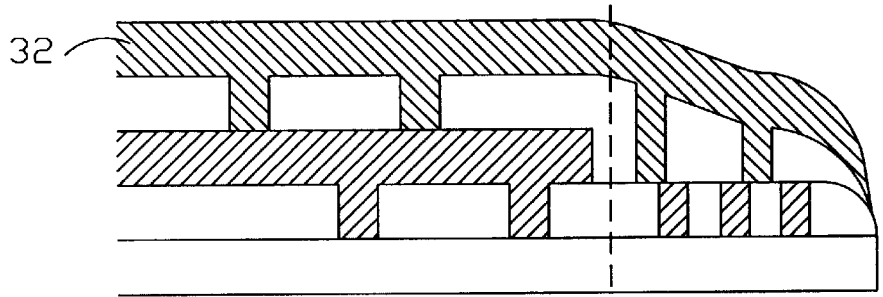
Figure 1D:
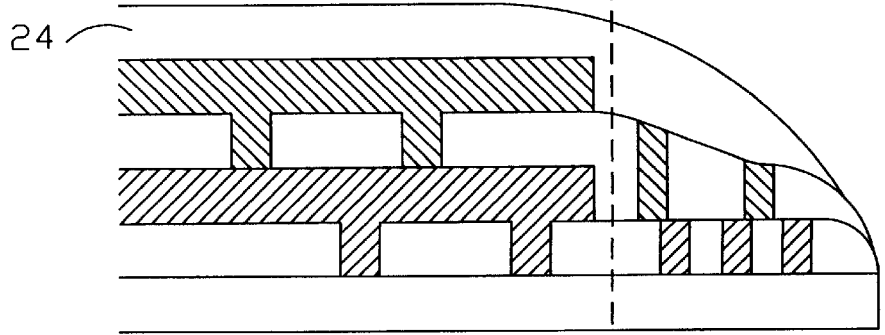

Similar process is performed in FIG. 1C, the silicon oxide layer 22 is patterned another interconnect holes and then another conductive layer 32 is deposited. The conductive layer 32 over uncompleted field is removed once again, as shown in FIG. 1D. A better uniformity for this CMP process is shown due to that the height between uncompleted field and semiconductor device is approximately the same. Another silicon oxide layer 24 is then deposited. Multilayer deposition is continued in sequential removing all conductive layers on uncompleted field.

The above description is a main portion of this invention, because all conductive layers have sufficient height such that causes topography issue. However, silicon nitride formed on the uncompleted field in process must be removed which will cause silicon nitride residue around semiconductor device. The silicon nitride is removed by using any conventional method and will not be shown in figure.

Figure 2:
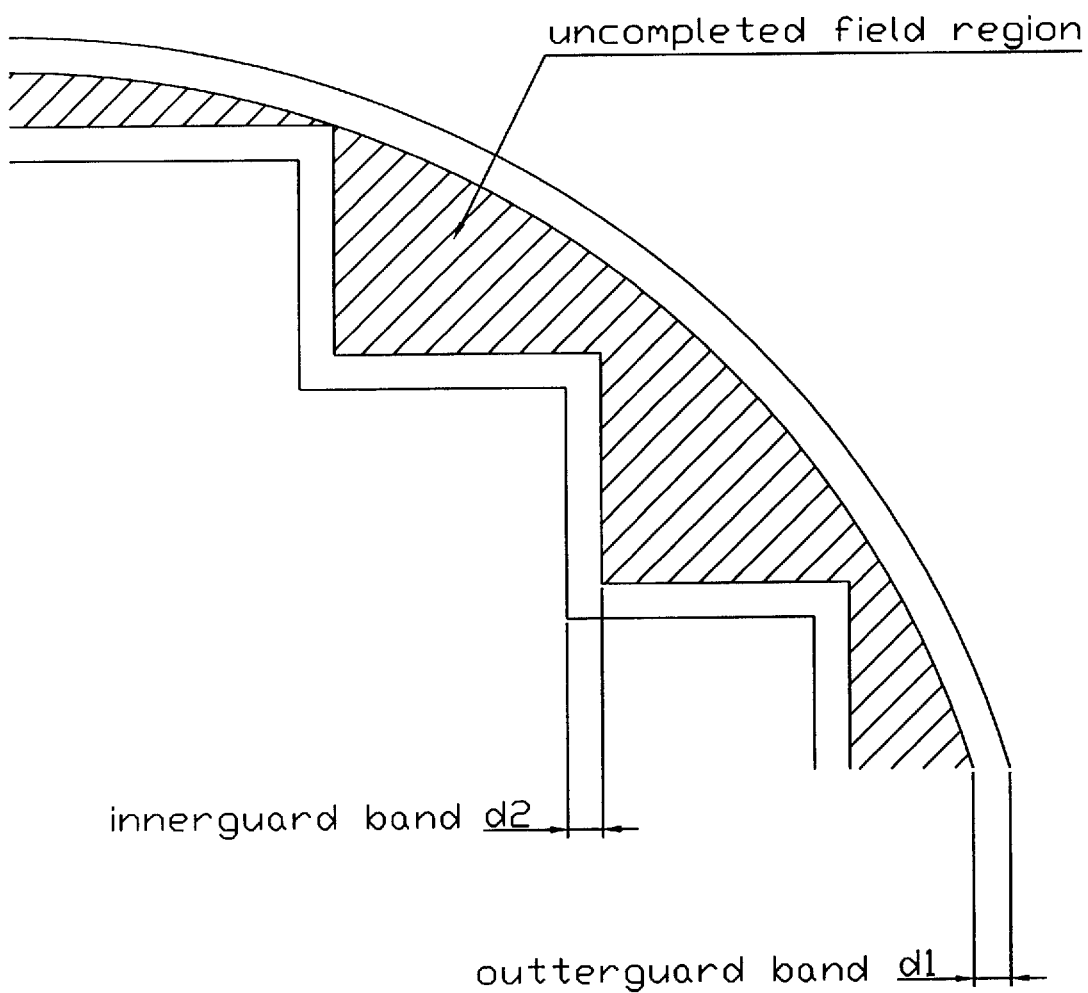
FIG. 2 is a top view of a portion of a wafer, wherein a band is preserved between semiconductor device and uncompleted fields.

FIG. 2 is a top view of a portion of a wafer, wherein the shaded area is uncompleted field of wafer edge. In this embodiment, the perimeter of this wafer leaves an outer-guard band-$d_1$, and between the uncompleted field and device leaves an inner-guard band-$d_2$. Without inner-guard band, process will cause miss photo-condition and particles. Moreover, the inner-guard band will prevent from AA-shift in lithography. In one embodiment, the width of $d_2$ is between about 0.1 to 100 um, but preferably 10 um.

Although specific embodiments have been illustrated and described, it will be obvious to those skilled in the art that various modifications may be made without departing from what is intended to be limited solely by the appended claims.

What is claimed is:

1. A method for forming a semiconductor device with avoiding CMP caused residue on uncompleted fields of wafer edge, said method comprising:

removing all conductive layers on said uncompleted fields in each metallization process;

thereby the height of said uncompleted fields will not higher than the height of said semiconductor device.

2. The method according to claim 1, further comprising removing all silicon nitride layers on said uncompleted fields.

3. The method according to claim 1, further comprising keeping a band between said semiconductor device and said uncompleted filed.

4. The method according to claim 3, wherein said band has a width between about 0.1 to 100 um.

5. The method according to claim 1, wherein said step of removing said conductive layer comprises exposing all said conductive regions on said uncompleted fields in lithographic process.

6. The method according to claim 1, wherein said conductive layer comprises metal.

7. The method according to claim 1, wherein said conductive layer comprises doped polysilicon.

8. A method for forming a semiconductor device with avoiding CMP caused residue on uncompleted fields of wafer edge, said method comprising:

providing a substrate;

forming a silicon oxide layer on said substrate;

performing a metallization process on said silicon oxide layer to connect said substrate;

removing all conductive layers formed on said uncompleted fields;

thereby the height of said uncompleted fields will not higher than the height of said semiconductor device.

9. The method according to claim 8, further comprising removing all silicon nitride layers on said uncompleted fields.

10. The method according to claim 8, further comprising keeping a band between said semiconductor device and said uncompleted filed.

11. The method according to claim 10, wherein said band has a width between about 0.1 to 100 um.

12. The method according to claim 8, wherein said step of removing said conductive layer comprises exposing all said conductive regions on said uncompleted fields in lithographic process.

13. The method according to claim 8, wherein said conductive layer comprises metal.

14. The method according to claim 8, wherein said conductive layer comprises doped polysilicon.

15. A method for forming a semiconductor device with avoiding CMP caused residue on uncompleted fields of wafer edge, wherein a band is reserved between said semiconductor device and said uncompleted, said method comprising:

removing all conductive layers on said uncompleted fields;

removing all silicon nitride layers on said uncompleted fields;

thereby the height of said uncompleted fields will not higher than the height of said semiconductor device.

16. The method according to claim 15, wherein said band has a width between about 0.1 to 100 um.

17. The method according to claim 15, wherein said step of removing said conductive layer comprises exposing all said conductive regions on said uncompleted fields in lithographic process.

18. The method according to claim 15, wherein said conductive layer comprises metal.

19. The method according to claim 15, wherein said conductive layer comprises doped polysilicon.

* * * * *